United States Patent
Fukazawa

(10) Patent No.: US 7,375,007 B2
(45) Date of Patent: May 20, 2008

(54) METHOD OF MANUFACTURING A SEMICONDUCTOR DEVICE

(75) Inventor: Motohiko Fukazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 398 days.

(21) Appl. No.: 11/030,165

(22) Filed: Jan. 7, 2005

(65) Prior Publication Data

US 2005/0153479 A1    Jul. 14, 2005

(30) Foreign Application Priority Data

Jan. 9, 2004    (JP) ............................. 2004-004003

(51) Int. Cl.
*H01L 21/30* (2006.01)
(52) U.S. Cl. ..................... 438/459; 438/460; 438/613
(58) Field of Classification Search ................ 438/459, 438/460, 613
See application file for complete search history.

(56) References Cited

U.S. PATENT DOCUMENTS

| 6,537,874 | B2 | 3/2003 | Nakamura et al. |
| 6,841,849 | B2 * | 1/2005 | Miyazawa ............ 257/621 |
| 7,029,937 | B2 * | 4/2006 | Miyazawa ............ 438/40 |

| 2002/0024118 | A1 | 2/2002 | Okoshi et al. |
| 2004/0142574 | A1 | 7/2004 | Miyazawa |

FOREIGN PATENT DOCUMENTS

| JP | A-60-7148 | 1/1985 |
| JP | A-3-209828 | 9/1991 |
| JP | A-2001-53218 | 2/2001 |
| JP | A-2002-76307 | 3/2002 |
| JP | A-2002-76308 | 3/2002 |
| JP | A-2003-17558 | 1/2003 |
| JP | A-2003-76111 | 3/2003 |
| JP | A-2003-197855 | 7/2003 |
| WO | WO 03/079431 A1 | 9/2003 |
| WO | WO 03/079432 A2 | 9/2003 |

* cited by examiner

*Primary Examiner*—Jack Chen
(74) *Attorney, Agent, or Firm*—Oliff & Berridge, PLC

(57) ABSTRACT

To provide a penetration electrode having high quality. A method of manufacturing a semiconductor device includes the following steps: (a) forming a concave part from a first face of a semiconductor substrate in which an integrated circuit is formed; (b) providing a resin layer at least on the bottom face of the concave part; (c) forming a conductive part to an inner side of the resin layer of the concave part; (d) disposing the resin layer from a second face opposite to the first face of the semiconductor substrate by wet etching; and (e) exposing the conductive part from the second face of the semiconductor substrate.

11 Claims, 5 Drawing Sheets

METHOD OF MANUFACTURING A SEMICONDUCTOR DEVICE

BACKGROUND

The present invention relates to a method of manufacturing a semiconductor device.

Some types of semiconductor devices have been developed in which three-dimensional packaging technology is employed. In addition, it is known that penetration electrodes are formed to semiconductor substrates in order to allow the three-dimensional packaging. For example, a concave part, in which a conductive part is formed, is formed from the surface of a semiconductor substrate. Then, the backside of the semiconductor substrate is polished and etched to expose the conductive part formed in the concave part. According to a conventional method, the conductive part may be exposed with etchants (etching solutions) in the case when a wet etching process is performed. In this case, if the conductive part does not have a characteristic of being not etched, even the conductive part is etched, thereby causing to form no penetration electrode. Meanwhile, it is important to enhance freedom of choice in materials for the conductive part or the etchants.

The present invention aims to form a penetration electrode having high quality.

[Patent Document 1] Japanese Unexamined Patent Publication No. 2001-53218.

SUMMARY (1) A method of manufacturing a semiconductor device according to the present invention includes the following steps: (a) forming a concave part from a first face of a semiconductor substrate in which an integrated circuit is formed; (b) providing a resin layer at least on a bottom face of the concave part; (c) forming a conductive part to an inner side of the resin layer of the concave part; (d) exposing the resin layer from a second face opposite to the first face of the semiconductor substrate by wet etching; and (e) exposing the conductive part from the second face of the semiconductor substrate. According to the invention, since the resin layer is made of a material that is often less easily wet etched, the conductive part can be prevented from being wet etched and being damaged. Therefore, a penetration electrode having high quality can be formed.

(2) In the method of manufacturing a semiconductor device, the resin layer may continuously be provided from the bottom face to an inner wall of the concave part in the step of (b). According to this, the conductive part can be protruded higher from the second face of the semiconductor substrate in the wet etching process because the resin layer covers the conductive part in the longitudinal direction of the concave part.

(3) In the method of manufacturing a semiconductor device, a material of the resin layer may be provided by means of a droplet discharge method in the step of (b).

(4) The method of manufacturing a semiconductor device further includes a step of forming an insulation layer to an inner side of the resin layer of the concave part after the step of (b). The conductive part may be formed to an inner side of the insulation layer in the step of (c). In this way, the conductive part and the semiconductor substrate can be electrically disconnected.

(5) The method of manufacturing a semiconductor device may further include a step of polishing the semiconductor substrate from the second face before the step of (d). This enables the semiconductor substrate to be thinner by removing a part of it in a simple and short time process.

(6) In the method of manufacturing a semiconductor device, the step of (e) may include the following steps: (e1) removing the resin layer, and (e2) dry etching the semiconductor substrate from the second face.

(7) The method of manufacturing a semiconductor device further may include a step of dicing the semiconductor substrate. The semiconductor substrate may include a step of forming the integrated circuit in multiple numbers, and a step of forming the concave part corresponding to each integrated circuit.

(8) The method of manufacturing a semiconductor device further includes a step of stacking the semiconductor device in multiple numbers, each semiconductor device being electrically interconnected with the conductive part.

DETAILED DESCRIPTION OF EMBODIMENTS

Figure 1:
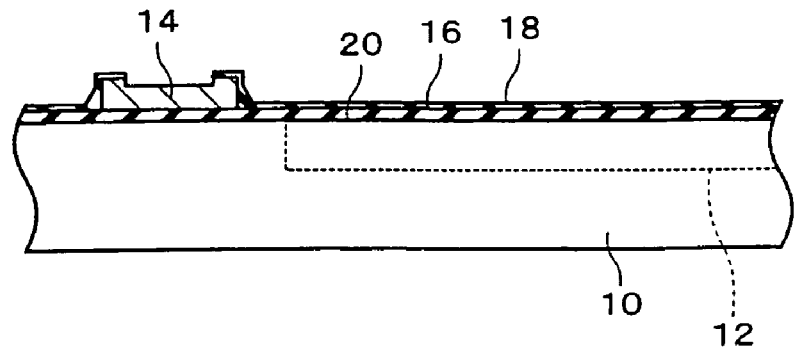
FIG. 1 is a diagram for explaining a method of manufacturing a semiconductor device according to one embodiment of the present invention.

Embodiments of the present invention will be described below with reference to accompanying drawings.

FIGS. 1 through 13 are diagrams for explaining a method of manufacturing a semiconductor device according to one embodiment of the present invention.

In the embodiment, a semiconductor substrate 10, for example, a silicon substrate, is used. The semiconductor substrate 10 can be a semiconductor wafer or a semiconductor chip. An integrated circuit 12 is provided to the semiconductor substrate 10. In the case where the semiconductor substrate 10 is diced to form a plurality of semiconductor chips, each semiconductor chip includes each integrated circuit 12. A plurality of electrodes 14 (for example, pads) is provided to the semiconductor substrate 10. Each electrode 14 is electrically connected to the integrated circuit 12. A plurality of electrodes 14 can be provided to one semiconductor chip (or the integrated circuit 12). Each electrode 14 can be made of aluminum. While the surface shape of the electrode 14 is not limited, often it is rectangular.

Passivation films 16 and 18 each of which is formed of a single layer or multiple layers are deposited on the semiconductor substrate 10. The passivation films 16 and 18 are made of $SiO_2$, SiN, polyimide resin or the like, for example. In the example shown in FIG. 1, the electrode 14 and a wiring (not shown) connecting the integrated circuit 12 and the electrode 14 are provided on the passivation film 16. The passivation film 18 is provided, leaving out at least a part of the surface of the electrode 14. The passivation film 18 may be formed to cover the surface of the electrode 14 and then partly etched to expose a part of the electrode 14. As for the etching, a dry etching or a wet etching can be applicable. The surface of the electrode 14 may be etched when the passivation film 18 is etched.

Figure 2:
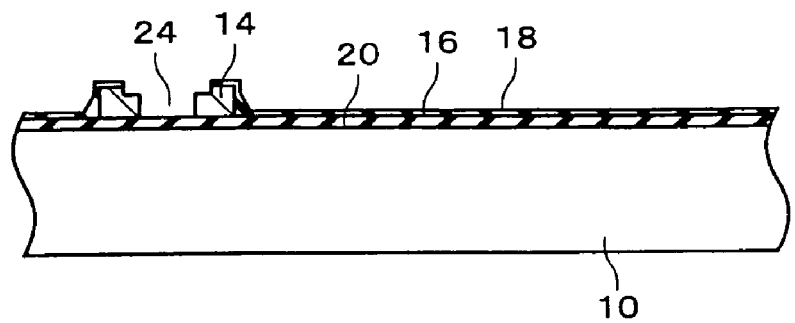
FIG. 2 is a diagram for explaining the method of manufacturing a semiconductor device according to the embodiment of the present invention.

In the embodiment, a concave part 22 (refer to FIG. 3) is formed from a first face 20 of the semiconductor substrate 10. The first face 20 is the face at the side where the electrode 14 (or the integrated circuit 12) is formed. The concave part 22 is formed to leave out elements and wirings of the integrated circuit 12. As shown in FIG. 2, a through-hole 24 may be formed to the electrode 14. Forming the through-hole 24 may be achieved by etching (dry etching or wet etching). The etching may be performed after forming a resist (not shown) that is patterned by lithography. In the case where the passivation film 16 is formed under the electrode 14, the through-hole 26 (refer to FIG. 3) is also formed thereto. If an etchant used for the electrode 14 does not work on the passivation film 16, another etchant may be used to form the through-hole 26. In this case, another resist (not shown) patterned by lithography may be formed.

Figure 3:
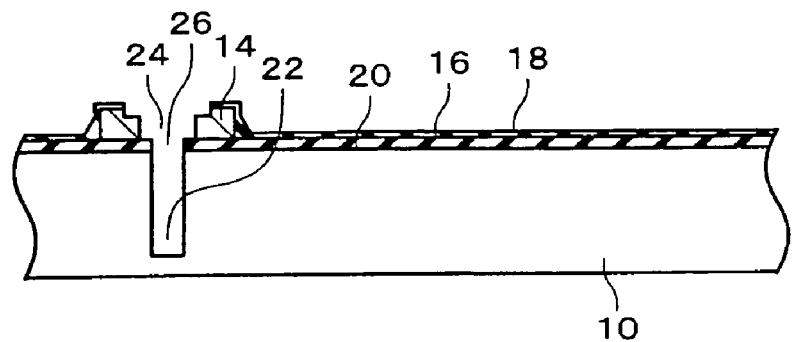
FIG. 3 is a diagram for explaining the method of manufacturing a semiconductor device according to the embodiment of the present invention.

As shown in FIG. 3, the concave part 22 is formed to the semiconductor substrate 10 so as to communicate with the through-hole 24 and the through hole 26. The through-hole 24, the through-hole 26 and the concave part 22 together can be referred to a concave part. Forming the concave part 22 also may be achieved by etching (dry etching or wet etching).

The etching may be performed after forming a resist (not shown) that is patterned by lithography. Alternatively, the concave part 22 may be formed with a laser (for example, $CO_2$ laser or YAG laser or the like). Such a laser may be used for forming the through-holes 24 and 26. Moreover, the concave part 22 and the through-holes 24 and 26 may be sequentially formed using a single type of etchant or laser. For another example, the concave part 22 may be formed by sandblasting.

Figure 4:
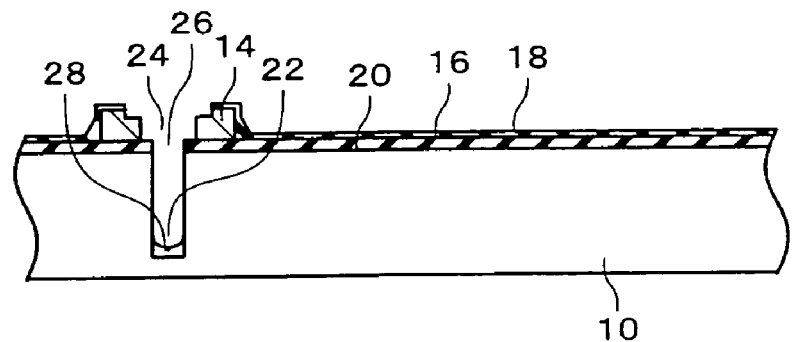
FIG. 4 is a diagram for explaining the method of manufacturing a semiconductor device according to the embodiment of the present invention.

As shown in FIG. 4, a resin layer 28 is provided at least on the bottom face (for example, only on the bottom face) of the concave part 22. The resin layer 28 is provided so as to cover the entire surface of the bottom of the concave part 22. Note that the concave part 22 is not buried with the resin layer 28. The concave part may be formed with the resin layer 28. Materials of the resin layer 28 may be discharged into the concave part 22 by means of a droplet discharge method. As an example of the droplet discharge method, an inkjet method may be applicable or discharge with a dispenser may be performed. For another example, the resin layer 28 may be printed to the region overlapping the concave part 22 (inner wall) by means of a printing method, for example, a screen printing. As for the materials for the resin layer 28, for example, a polyimide resin or known ones used for semiconductor device manufacturing processes may be used. If the resin layer 28 has a thermosetting property, a curing process may be included in the process for providing the resin layer 28.

Figure 5:
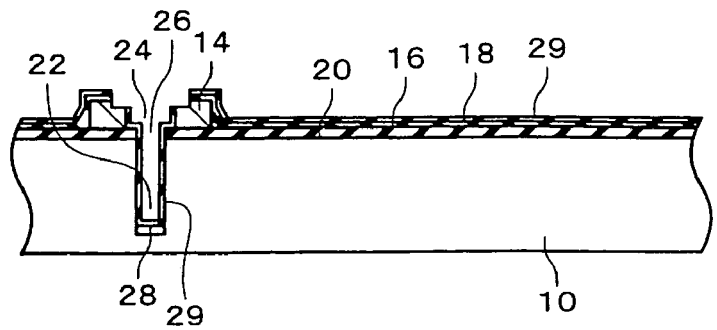
FIG. 5 is a diagram for explaining the method of manufacturing a semiconductor device according to the embodiment of the present invention.

As shown in FIG. 5, an insulation layer 29 may be formed inside the concave part 22. The insulation layer 29 is formed to the inner side of the resin layer 28 of the concave part 22. The insulation layer 29 may be an oxide film or a nitride film. For example, if the semiconductor substrate 10 is made of silicon, the insulation layer 29 may be a silicon oxide ($SiO_2$) film or a silicon nitride (SiN) film. While, in the example shown in FIG. 5, the insulation layer 29 is formed on the resin layer 28 at the bottom face of the concave part 22, it is not necessary to form the insulation layer 29 in the case where the insulation treatment can be achieved using only the resin layer 28. As shown in FIG. 5, the insulation layer 29 is also formed to the inner wall of the concave part 22 in the case where the inner wall of the concave part 22 is exposed. The insulation layer 29 is formed so as not to bury the concave part 22. That is, a concave part is formed with the insulation layer 29. The insulation layer 29 may be formed on the inner wall of the through-hole 26 in the passivation film 16. The insulation layer 29 may be formed on the passivation film 18.

The insulation layer 29 may be formed on the inner wall of the through-hole 24 in the electrode 14. The insulation layer 29 is formed to leave out a part of the electrode 14 (for example, its top surface). Alternatively, the insulating layer 29 may be formed to cover the entire surface of the electrode 14 and then partly etched (dry etching or wet etching) to expose a part of the electrode 14. The etching may be performed after forming a resist (not shown) that is patterned by lithography.

Figure 6:
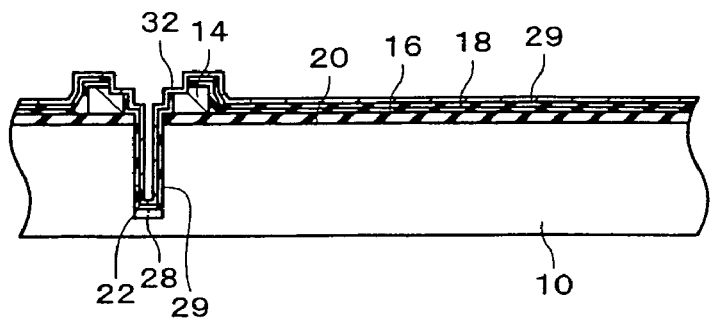
FIG. 6 is a diagram for explaining the method of manufacturing a semiconductor device according to the embodiment of the present invention.

Next, a conductive part 30 (refer to FIG. 7) is provided to the concave part 22. The conductive part 30 is formed to the inner side of the resin layer 28 in the concave part 22. The conductive part 30 is formed to the inner side of the insulation layer 29 in the concave part 22. The conductive part 30 may be formed with copper (Cu) or tungsten (W) or the like. As shown in FIG. 6, a central part 34 of the conductive part 30 may be formed after forming an outer layer 32 thereof. The central part 34 can be formed with Cu or W or doped silicon (for example, low-temperature polysilicon). The outer layer 32 may include at least a barrier layer. The barrier layer prevent the central part 34 or the material of a seed layer explained next from diffusing to the semiconductor substrate 10 (for example, Si). The barrier layer may be formed with material (for example, titanium tungsten (TiW) or titanium nitride (TiN)) different from that of the central part 34. In the case where the central part 34 is formed by means of an electrolytic plating, the outer layer 32 may include the seed layer. The seed layer is formed after forming the barrier layer. The seed layer is formed with the same material as that of the central part 34 (for example, Cu). Here, the conductive part 30 (at least the central part 34) may be formed by an electroless plating or an inkjet method.

Figure 7:
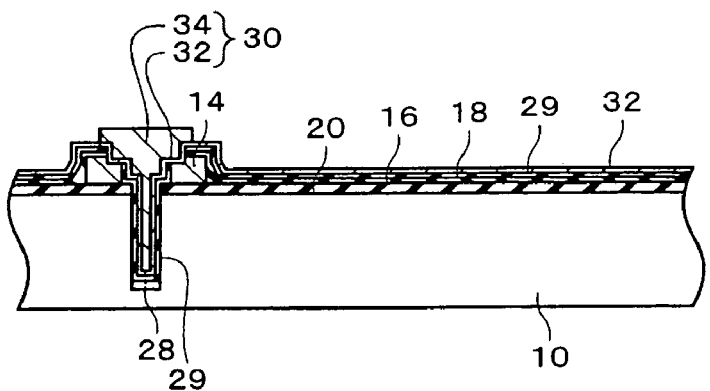
FIG. 7 is a diagram for explaining the method of manufacturing a semiconductor device according to the embodiment of the present invention.
Figure 8:
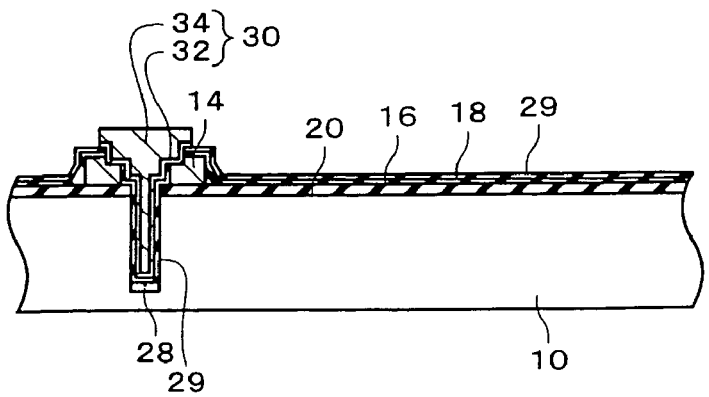
FIG. 8 is a diagram for explaining the method of manufacturing a semiconductor device according to the embodiment of the present invention.

In the case where the outer layer 32 is also formed on the passivation film 18 as shown in FIG. 7, a part of the outer layer 32 on the passivation film 18 (and the insulation layer 29) is etched. The conductive part 30 can be provided by forming the outer layer 32, followed by forming the central part 34. A part of the conductive part 30 is located in the concave part 22 of the semiconductor substrate 10. Since the insulation layer 29 intervenes between the inner wall of the concave part 22 and the conductive part 30, the electrical connection between them is disconnected. The conductive part 30 is electrically connected to the electrode 14. For example, the conductive part 30 may contact to an exposed part of the electrode 14 on which the insulation layer 29 is not formed. A part of the insulation layer 30 may be located on the passivation film 18. The conductive part 30 may be provided only in the region of the electrode 14. The conductive part 30 may protrude at least above the concave part 22. For example, the conductive part 30 may be protruded from the passivation film 18 and the insulation layer 29.

Figure 9:
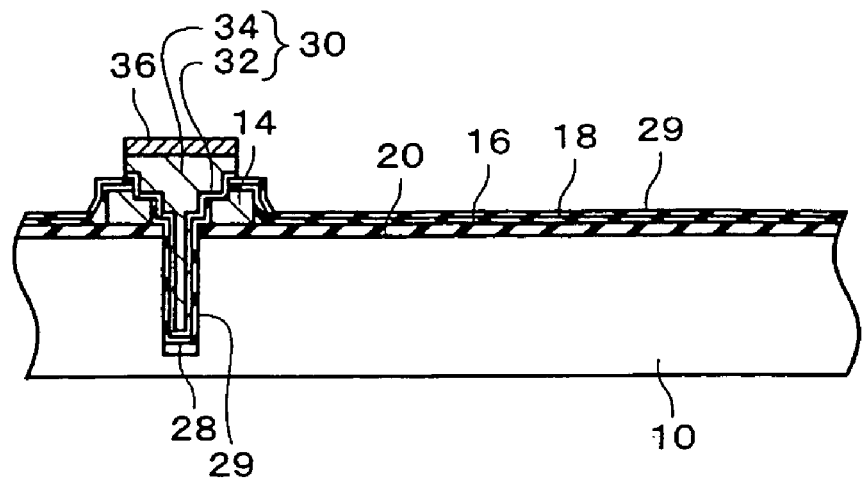
FIG. 9 is a diagram for explaining the method of manufacturing a semiconductor device according to the embodiment of the present invention.

As shown in FIG. 9, a brazing material 36 may be provided on the conductive part 30. The brazing material 36 may be made of soft solder or a hard solder, for example, a solder. The brazing material 36 may be formed with a resist covering the region excluding the conductive part 30.

Figure 10:
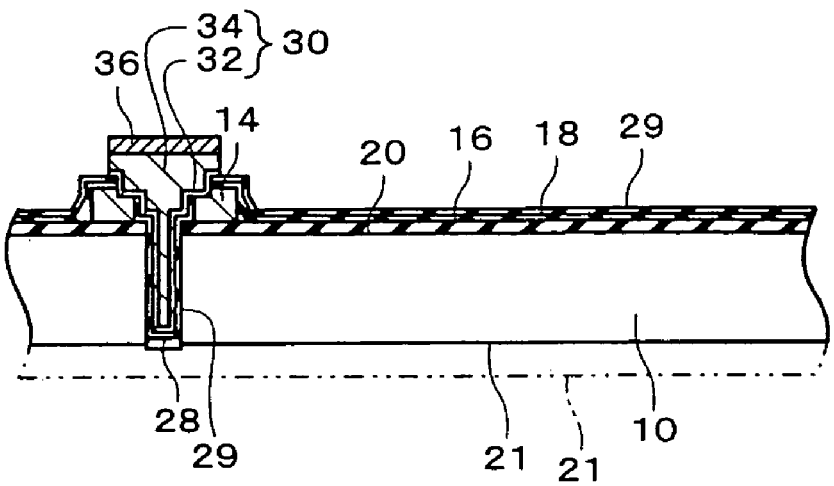
FIG. 10 is a diagram for explaining the method of manufacturing a semiconductor device according to the embodiment of the present invention.

As shown in FIG. 10, the resin layer 28 is exposed from a second face 21 (opposite face to the first face 20) of the semiconductor substrate 10 by performing a wet etching. Before the wet etching process, the semiconductor substrate 10 may be polished (grinded) from the second face 21. For example, the semiconductor substrate 10 may be processed by at least one of the methods of mechanical polishing, mechanical grinding, chemical polishing, and chemical grinding. The process is performed before exposing the resin layer 28 provided to the concave part 22. The process enables the semiconductor substrate 10 to be thinner by removing a part of it in a simple and short time process. Alternatively, a wet etching may be performed by skipping this process.

A part of the semiconductor substrate 10 is removed to the thickness at which the resin layer 28 is exposed by performing a wet etching. In this case, the conductive part 30 is not disposed. It is preferable that the insulation layer 28 is not disposed, but it can be disposed. A wet etching (so-called spin etching) may be performed as dropping an etchant (etching solution) to the second face 21 of the semiconductor substrate 10 while spinning the semiconductor substrate 10. As for the etchant, a mixed liquid of hydrofluoric acid and nitric acid, or of hydrofluoric acid, nitric acid and acetic acid may be used. If this process is performed after the polishing and grinding process, cracks occurred in the polishing and grinding process can be removed in this process. In addition, the wet etching can be performed at faster processing speed and in simpler process than the dry etching.

According to the embodiment, the resin layer 28 is less easily wet etched (etching rate is low) than any of the insulation layer 29 (for example, $SiO_2$) and the conductive part 30 (for example, Cu). Possibly, the resin layer 28 is often made of materials that are less easily wet etched than those. Thus, the resin layer 28 is not wet etched. This enables the conductive part 30 not to be wet etched, whereby the conductive part 30 can be prevented from being damaged. As the result, a penetration electrode having high quality can be formed. In addition, yield rate can be increased in terms of a method of manufacturing a semiconductor device. Further, for example, the etching amount of the semiconductor substrate 10 can be increased by the wet etching performed under long time or high concentration without giving any damage to the conductive part 30. This enables excellent etching performance to be achieved. Moreover, since the conductive part 30 is less easily wet etched irrespective of the choice in its materials or etchants, the freedom of choice in materials for the conductive part 30 or etchants can be enhanced.

Figure 11:
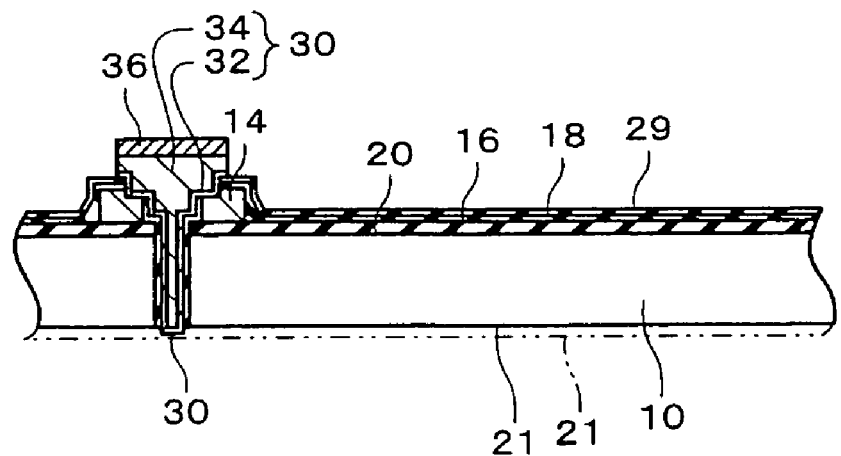
FIG. 11 is a diagram for explaining the method of manufacturing a semiconductor device according to the embodiment of the present invention.

As shown in FIG. 11, the conductive part 30 is disposed from the second face 21 of the semiconductor substrate 10. Firstly, the resin layer 28 is removed. This may expose the insulation layer 29. The resin layer 28 may be removed, for example, using a predetermined solvent for dissolving the resin.

Subsequently, the semiconductor substrate 10 may be dry etched from the second face 21. The conductive part 30 may be protruded in such a way that it is covered with the insulation layer 28 or exposed from the insulation layer 28. The etching may be performed using an etchant that works more on the semiconductor substrate 10 (of silicon, for example) than on the insulation layer 29 (of $SiO_2$, for example). The etchant may be $SF_6$ or $CF_4$ or $Cl_2$ gas. If feasible, the resin layer 28 may be removed by dry etching.

The conductive part 30 can be exposed (or be protruded) from the second face 21 of the semiconductor substrate 10 by means of the above-mentioned processes. The conductive part 30 becomes the penetration electrode penetrating from the first face 20 to the second face 21 of the semiconductor substrate 10. In the embodiment, the penetration electrode can be prevented from being damaged.

Figure 12:
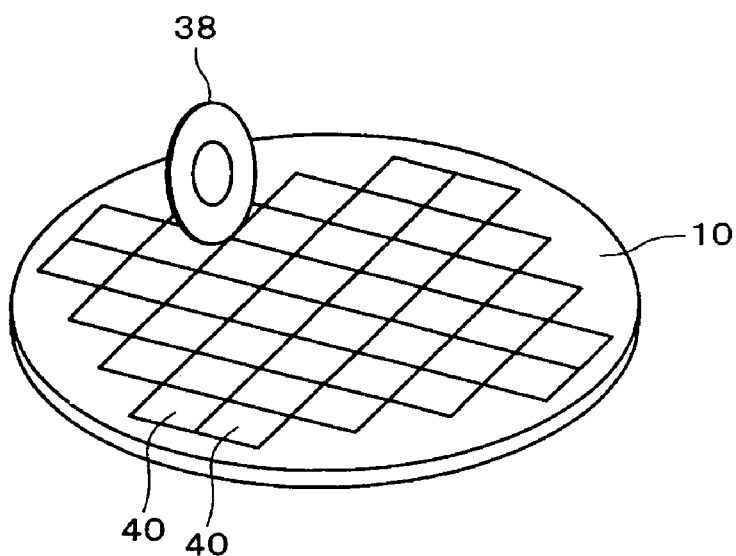
FIG. 12 is a diagram for explaining the method of manufacturing a semiconductor device according to the embodiment of the present invention.

As shown in FIG. 12, in the case where the semiconductor substrate 10 is a semiconductor wafer, the concave part 22 and the like may be formed corresponding to each integrated circuit 12 (refer to FIG. 1) and then the semiconductor substrate 10 may be diced (for example, dicing). Dicing may be performed with a cutter 38 (for example, a dicer) or with a laser (for example, $CO_2$ laser or YAG laser or the like). In this way, the semiconductor substrate 10 can be divided to a plurality of semiconductor chips 40.

Figure 13:
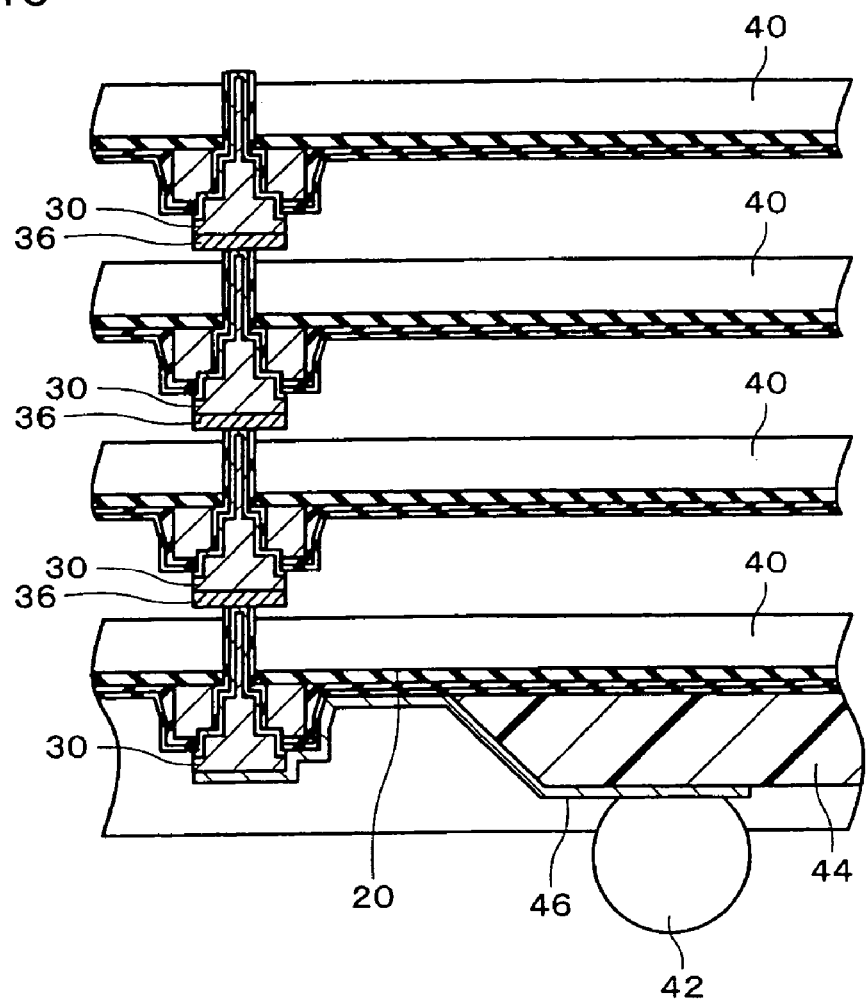
FIG. 13 is a diagram for explaining the method of manufacturing a semiconductor device according to the embodiment of the present invention.

As shown in FIG. 13, a plurality of semiconductor devices (for example, the semiconductor chip 40) may be stacked, and then each device may be electrically interconnected with the conductive part 30 and the brazing material 36. The embodiment is effective when such three dimensional packaging is performed. In the example shown in FIG. 13, the semiconductor device includes a plurality of semiconductor chips 40. The semiconductor chip 40 includes an external terminal 42 (for example, solder ball), the semiconductor chip 40 being located outermost in a direction of the first face 20 (the lowest in FIG. 13). The external terminal 42 is provided on a wiring 46 formed on a stress-relieving layer 44 (for example, resin layer). The wiring 46 is electrically connected to the conductive part 30 at the first face 20 side.

Figure 14:
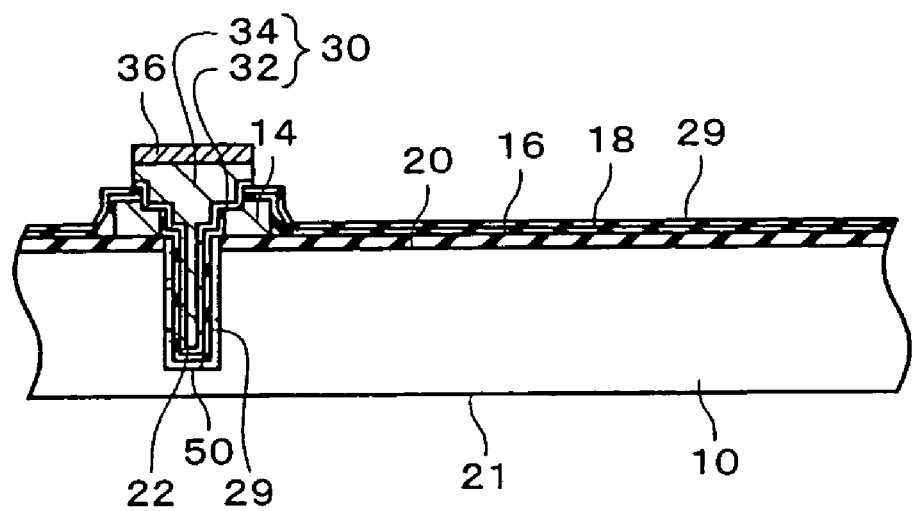
FIG. 14 is an explanatory diagram showing one modification of the embodiment.

FIG. 14 is an explanatory diagram showing one modification of the embodiment. In the modification, a resin layer 50 is continuously provided from the bottom face to the inner wall of the concave part 22. In this case, a concave part is formed inside the resin layer 50 such that the concave part 22 is not buried with the resin layer 50. As shown in FIG. 14, the resin layer 50 may cover the entire surface of the inner wall (a part of the semiconductor substrate 10) of the concave part 22 or a part of the inner wall (a part near the bottom face of the concave part 22). The resin layer 50 may be provided so as to cover the entire surface of the inner wall of the concave part 22. According to the embodiment, in addition to the effects of the above-mentioned embodiment, the conductive part 30 can be protruded higher from the second face 21 of the semiconductor substrate 10 because the resin layer 50 covers the conductive part 30 and the insulation layer 29 in the longitudinal direction of the concave part 22. Other details can be applied as the same as mentioned above.

Figure 15:
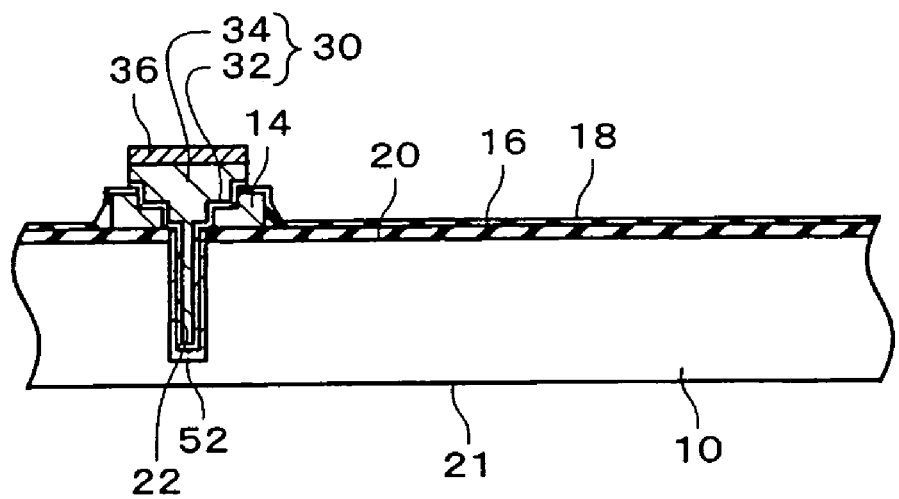
FIG. 15 is an explanatory diagram showing another modification of the embodiment.

FIG. 15 is an explanatory diagram showing another modification of the embodiment. In the modification, the resin layer 52 is provided at least on the bottom face of the concave part 22 (in FIG. 15, the bottom face and inner wall continuously extended from the bottom face), and then the conductive part 30 is formed to the inner side of the resin layer 52 of the concave part 22. In the modification, the insulation layer 29 described above is not formed. In other words, the insulation layer formed inside the concave part 22 is provided with a resin. A concave part is formed inside the resin layer 52 such that the concave part 22 is not buried with the resin layer 52. In order to realize the insulation between the conductive part 30 and the semiconductor substrate 10, the resin layer 28 is provided so as to entirely cover the inner face (bottom face and inner wall) of the concave part 22. According to the modification, in addition to the effects of the above-mentioned modification, manufacturing processes can be simplified because the process for forming the insulation layer 29 can be omitted.

The present invention is not limited to the above-described embodiments but applied to various kinds of modifications. For example, the invention includes substantially the same structures as those described in the embodiments (for example, structures where methods and results are the same, or structures where aims and results are the same). In addition, the invention includes structures obtained by replacing nonessential parts of the structure described in the embodiments. The invention includes structures that can achieve the same actions and advantageous effects as those of the structure described in the embodiments, or structures that can achieve the same purposes as those thereof. In addition, the invention includes structures obtained by adding the related art to the structure detailed in the embodiments.

What is claimed is:

1. A method of manufacturing a semiconductor device comprising:
   (a) forming a concave part from a first face of a semiconductor substrate in which an integrated circuit is formed;
   (b) providing a resin layer at least on a bottom face of the concave part;
   (c) forming a conductive part to an inner side of the resin layer of the concave part;
   (d) exposing the resin layer from a second face opposite to the first face of the semiconductor substrate by wet etching; and
   (e) exposing the conductive part from the second face of the semiconductor substrate.

2. The method of manufacturing a semiconductor device according to claim 1, wherein the resin layer is continuously provided from the bottom face to an inner wall of the concave part in the step of (b).

3. The method of manufacturing a semiconductor device according to claim 1, wherein a material of the resin layer is provided by means of a droplet discharge method in the step of (b).

4. The method of manufacturing a semiconductor device according to claim 1, further comprising:
   forming an insulation layer to an inner side of the resin layer of the concave part after the step of (b), wherein the conductive part is formed to an inner side of the insulation layer in the step of (c).

5. The method of manufacturing a semiconductor device according to claim 1, further comprising:
   polishing the semiconductor substrate from the second face before the step of (d).

6. The method of manufacturing a semiconductor device according to claim 1, wherein the step of (e) includes:
   (e1) removing the resin layer; and
   (e2) dry etching the semiconductor substrate from the second face.

7. The method of manufacturing a semiconductor device according to claim 1, further comprising:
   dicing the semiconductor substrate, the semiconductor substrate including:
      forming the integrated circuit in multiple numbers; and
      forming the concave part corresponding to each integrated circuit.

8. The method of manufacturing a semiconductor device according to claim 1, further comprising:
   stacking the semiconductor device in multiple numbers, each semiconductor device being electrically interconnected with the conductive part.

9. The method of manufacturing a semiconductor device according to claim 5, wherein a material of the resin layer is provided by means of a droplet discharge method in the step of (b).

10. The method of manufacturing a semiconductor device according to claim 5, further comprising:
    forming an insulation layer to an inner side of the resin layer of the concave part after the step of (b), wherein the conductive part is formed to an inner side of the insulation layer in the step of (c).

11. The method of manufacturing a semiconductor device according to claim 5, wherein the step of (e) includes:
    (e1) removing the resin layer; and
    (e2) dry etching the semiconductor substrate from the second face.

* * * * *